United States Patent [19]

Isern-Flecha et al.

[11] Patent Number: 5,557,064
[45] Date of Patent: Sep. 17, 1996

[54] CONFORMAL SHIELD AND METHOD FOR FORMING SAME

[75] Inventors: Ileana Isern-Flecha, Boca Raton; Thomas J. Swirbel, Davie; Robert W. Pennisi, Boca Raton; Danny E. Ross, Plantation; Adolph Naujoks, Coral Springs; Angelita Alarcon, Sunrise, all of Fla.

[73] Assignee: Motorola, Inc., Schaumburg, Ill.

[21] Appl. No.: 228,767

[22] Filed: Apr. 18, 1994

[51] Int. Cl.⁶ ................................................. H05U 9/00
[52] U.S. Cl. ............................ 174/35 MS; 361/818
[58] Field of Search ................... 174/35 R, 35 GC, 174/35 MS; 361/816, 818; 428/242, 263, 285, 910

[56] References Cited

U.S. PATENT DOCUMENTS

| | | | |
|---|---|---|---|
| 3,756,399 | 9/1973 | Cosier et al. | 206/80 A |
| 4,774,148 | 9/1988 | Goto | 428/607 |
| 4,868,033 | 9/1989 | Nauano et al. | 174/35 MS |
| 4,896,001 | 1/1990 | Pitts et al. | |
| 5,132,191 | 7/1992 | Zarnoch | 428/626 |
| 5,164,542 | 11/1992 | Hart | 174/35 MS |
| 5,166,864 | 11/1992 | Chitwood et al. | 174/35 R |
| 5,170,321 | 12/1992 | Oslund et al. | 174/35 R |
| 5,177,324 | 1/1993 | Carr et al. | 174/35 R |
| 5,394,304 | 2/1995 | Jones | 174/35 R |
| 5,436,803 | 7/1995 | Annis et al. | 361/818 |

OTHER PUBLICATIONS

3 M 6100 User Guide "Thermoformable EMI Shielding Material", Publication No. 34–7036–8334–1 (0841) LP, 1993.

Primary Examiner—Kristine L. Kincaid
Assistant Examiner—Christopher Horgan
Attorney, Agent, or Firm—Andrew S. Fuller

[57] ABSTRACT

A conformal shield (10) includes a conformal shield base (15), and a conductive layer (16). The conformal shield base (10) has a first conformable insulating material (12) having a characteristic softening point at a first temperature. A second conformable insulating material (14), which has a characteristic softening point at temperature higher than the first temperature, is overlaid on the first conformable insulating material (12). The conductive layer (16) is disposed on the conformal shield base (15) to form the shield (10).

21 Claims, 3 Drawing Sheets

5,557,064

CONFORMAL SHIELD AND METHOD FOR FORMING SAME

TECHNICAL FIELD

This invention relates in general to shields used in electronic devices, and more particularly, to shields for protecting electrical components.

BACKGROUND

Electronic products typically have electrical circuitry implemented on a circuit substrate, such as a printed circuit board. The performance of the circuitry may be adversely affected by factors such as electromagnetic interference (EMI), radio frequency interference (RFI), electrostatic discharge (ESD), and environmental elements. The sources of interference may be internal or external to the product. For example, many electrical components emit radio frequency (RF) signals which may adversely affect the operation of other portions of the circuitry. Moreover, these RF signals may cause interference for other electronic devices operating nearby.

Typically, a product designer incorporates shields, or other protective devices, to protect critical portions of the circuitry, or specific components. For example, to protect against EMI, a critical component is enclosed in EMI shield formed to substantially enclose the component and onto the circuit substrate. Components having a high EMI output are identified and electromagnetically isolated using EMI shields. Moreover, the shield components may be a part of a larger electrical module, such as power amplifier, which is preferably housed in EMI shielded enclosures to provide further protection.

Prior art shielding techniques include metal cans, metal foil claddings, wire mesh screens, and plastic enclosures or cases having metalized coatings. However, several problems associated with prior art shielding techniques need to be overcome. For example, a product may have many components requiring EMI shielding from other components within the product as well as from external sources. Depending on the number of the shields needed, significant weight and cost may be added to the product. Moreover, space must be allocated on the circuit board to accommodate the shields which reduces the space available for other components. Additionally, prior art shielding techniques typically do not facilitate shielding decisions made late in the product design cycle, which may be necessary after product testing. Consequently, major redesigns may be needed to add shields where the need was unanticipated.

The trend toward increasingly smaller products minimizes the space available on the circuit board for many of the shields typically used in the prior art. Cost, weight, and design convenience are also important factors in evaluating shielding options. These and other issues make prior art shielding techniques inadequate for some applications. Therefore, there exists a need for a new approach to EMI and other types of shielding.

DETAILED DESCRIPTION OF THE PREFERRED EMBODIMENT

The present invention provides for a conformal shield for shielding an article. The shield is described as being conformal because it is formed to conform or adapt to the shape of the article to be shielded. The conformal shield may be used to shield an electrical component, a circuit assembly or portions thereof, an electronic device, such as by shielding the device housing, and the like. Shielding may be desirable to protect circuit assembly components from internally and externally sourced interfering elements. For example, circuit assembly components can be shielded to provide protection from electro-magnetic interference, electro-static discharge, and environmental elements such as moisture, dust, and environmental contaminants. Additionally, by shielding a particular component, that component is protected from potential interference from other components of the circuit assembly. Moreover, other components are protected from interference sourced at the particular component. The present invention provides novel combinations of materials and procedures for use in the construction of the conformal shield, and novel applications therefor.

Figure 1:
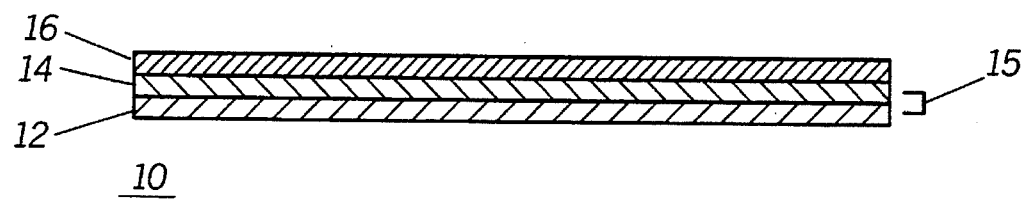
FIG. 1 is a cross-sectional view of a conformal shield in accordance with the present invention.

Referring to FIG. 1, a cross-sectional view of a conformal shield 10 is shown, in accordance with the present invention. The conformal shield 10 is formed from a conformable material that can be adapted to the shape of articles upon which it is disposed. In the preferred embodiment, the conformal shield 10 has a low temperature softening point and is responsive to the application of thermal energy, optionally assisted by a vacuum process, to shrink around or conform to an article which is to be shielded. Thus, the conformal shield 10 is typically disposed over the article and thermally activated to conform to the article.

The conformal shield 10 comprises a base 15 and a conductive layer 16 disposed on the base 15. The conformal shield base 15 includes first and second layers 12, 14 of conformable insulating material. The material of the first conformable insulating layer 12 is selected to have a characteristic softening point at a low processing temperature. Polypropylene, polyethylene, and other polymers with a low processing temperature, are among the materials suitable for forming the first insulating layer 12. The second conformable insulating layer 14 is formed to have a characteristic softening point at a temperature higher than the processing temperature of the material of the first insulating layer 12, under similar conditions. In the preferred embodiment, a thin continuous sheet of polypropylene is used for the first insulating layer 12, and nylon, which has a higher processing temperature than polypropylene, is used for the second insulating layer 14. The conformal shield base 15 is formed by overlaying or disposing the second insulating layer 14 on the first insulating layer 12. Preferably, the first and second insulating layers 12, 14 are co-laminated, or otherwise attached, to facilitate processing. The significance of the different processing temperature characteristics of the insulating layers will be described in more detail below.

The conductive layer 16 comprises conductive material disposed on or overlaid onto the conformal shield base 15. Preferably, the conductive layer 16 is disposed on the second insulating layer 14 of the conformal shield base 15. In the preferred embodiment, the conductive layer 16 is a conductive fabric formed from polyester impregnated or coated with conductive material such as metal. The metal should be malleable, or one with a low softening point, so that the metal becomes pliable during processing. Materials such as conductive plastics, conductive paints, metal films, metal meshes or screens, or semiconducting material, could be used for this layer. Magnetic organic/molecular based materials may also be used in the conductive layer 16. The properties of the metal may be chosen for a proper thermal, grounding, and/or shielding requirements. For example, if the conformal shield 10 is to be used as an electromagnetic interference shield, a conductive material such as copper, silver, or nickel, would be chosen. If heat dissipation characteristics were of primary importance, a conductive material comprising aluminum nitride might be preferred. Techniques for forming the conductive layer 16 include vacuum or flame metalization, electroless plating, and the like.

The conformal shield 10 has a low temperature softening point and is responsive to the application of thermal energy, optionally assisted by a vacuum process, to shrink around or conform to articles upon which it is disposed. Ordinarily, the conformal shield 10 is applied to an article such that the insulating layer having the lower temperature softening point, i.e., the first insulating layer 12, is positioned closer to the article than the insulating layer having the higher temperature softening point material, i.e., the second insulating layer 14. Sufficient thermal energy is applied to the conformal shield 10 so as to soften the material of the first insulating layer 12 but not enough to soften the material of the second insulating layer 14. Consequently, the softened first insulating layer 12 adheres to the article pulling the other layers along. Yet, the second insulating layer 14, not having reached its softening point, maintains its structural integrity, thereby providing support for the conductive layer 16 and structural form for the shield.

Figure 2:
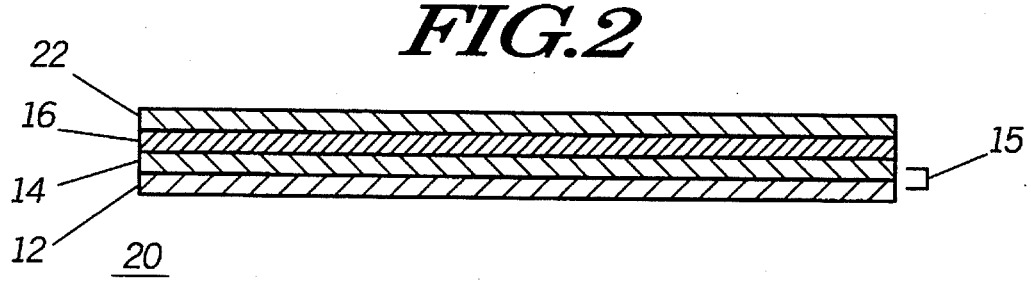
FIG. 2 is a cross-sectional view of a second embodiment of the conformal shield of the present invention.
Figure 3:
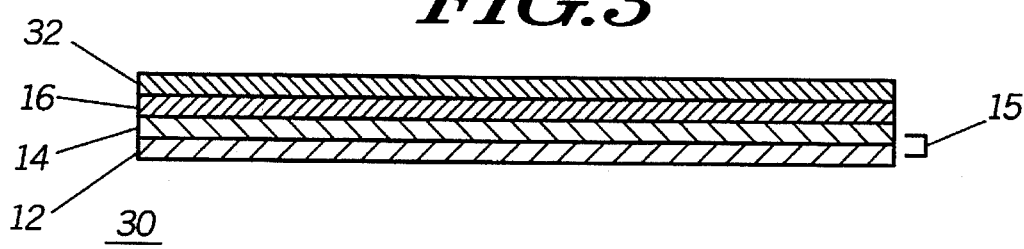
FIG. 3 is a cross-sectional view of a third embodiment of the conformal shield of the present invention.
Figure 4:
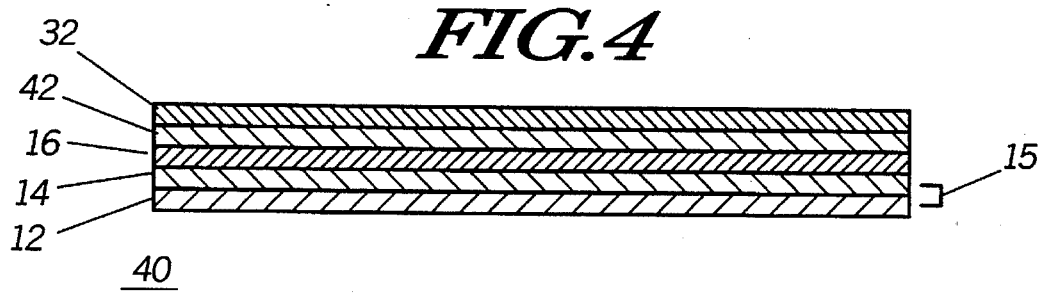
FIG. 4 is a cross-sectional view of a fourth embodiment of the conformal shield of the present invention.

Variations in the construction of the conformal shield 10 impart different characteristics to the shield. In FIG. 2, a second conformal shield 20 is shown, in accordance with the present invention. The second conformal shield 20 is of similar construction to the first 10, except that a third layer 22 of conformable material forms a protective covering for the conductive layer 16. Such a layer may be formed from corrosion-resistant metal, corrosion inhibiting organic material, plastic, or other materials suitable for use as an environmental protectant. FIG. 3 shows a third conformal shield 30 having a second conductive layer 32 disposed on the first conductive layer 16. This second conductive layer 32 can be formed to have characteristics to serve a different function than that of the first conductive layer 16. For example, the second conductive layer 32 could be formed to have high heat dissipation characteristics, while the first conductive layer 16 has high electrical conductivity for electromagnetic interference protection. Additionally, multiple conductive layers can be used to accommodate the needs of a variety of shielding applications. FIG. 4 shows a fourth conformal shield 40, similar in construction to the third conformal shield 30, in which a third layer of conformable insulating material is disposed between the conductive layers 16, 32 to further enhance shielding performance.

Figure 5:
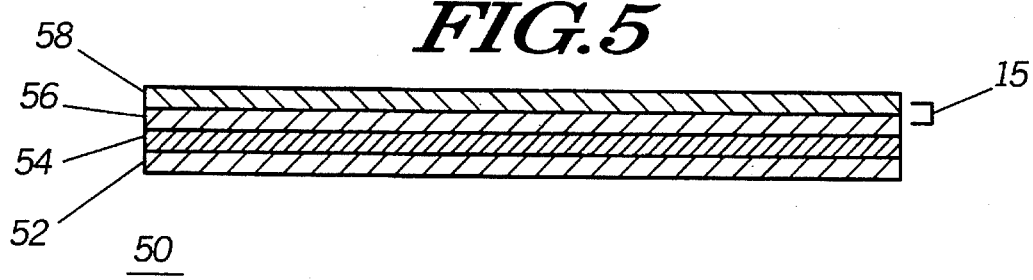
FIG. 5 is a cross-sectional view of a fifth embodiment of the conformal shield of the present invention.

Referring to FIG. 5, a fifth conformal shield 50 is shown, in accordance with the present invention. The construction of the fifth conformal shield 50 varies from that of the first four conformal shields 10, 20, 30, 40 described above. In this case, a conductive layer 54 is disposed on a first layer 52 of conformable insulating material having a characteristic softening point at a low processing temperature. A second layer 56 of conformable insulating material, also having a characteristic softening point at a low processing temperature, is disposed or overlaid on the conductive layer 54. The materials of the first and second insulating layers 52, 56 may be similar or may have softening points at a substantially equal temperatures. A third layer 58 of conformable insulating material, having a characteristic softening point at a temperature higher than that of the material of the first and second insulating layers 52, 56, is disposed on the second insulating layer 56. The second and third insulating layers 56, 58 function as the conformal shield base 15 described above.

Figure 6:
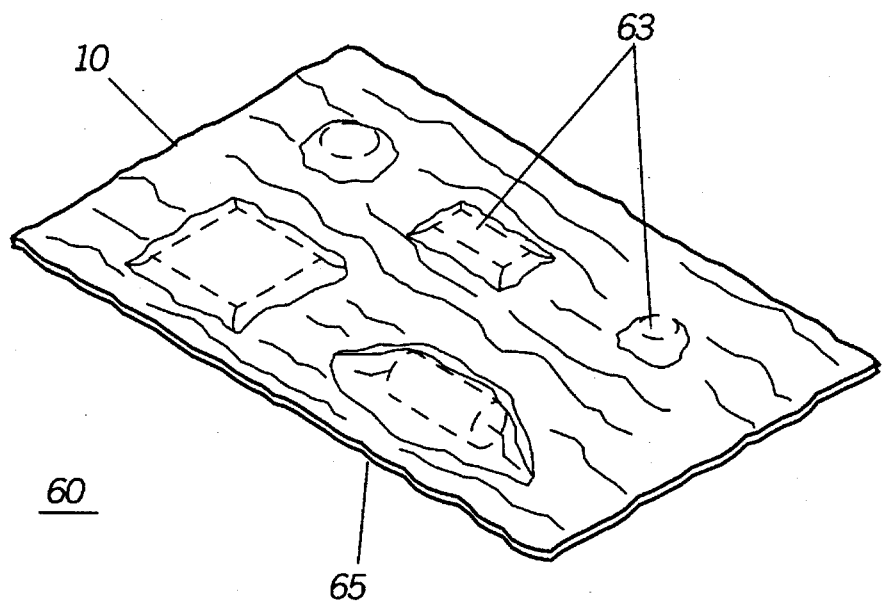
FIG. 6 is a perspective view of a shielded circuit assembly in accordance with the present invention.

Referring to FIG. 6, a shielded circuit assembly 60 is shown in accordance with the present invention. The shielded circuit assembly 60 includes a circuit substrate 65, such as a printed circuit board, electrical or other circuit components 63 disposed on the circuit substrate 65, and the first conformal shield 10, disposed so as to conform about the component and at least a portion of the circuit substrate. The resulting structure is a substantially enclosed circuit assembly 60 which provides shielding to individual circuit components 63. Although, the first conformal shield 10 is used for the purposes of discussion, one skilled in the art would appreciate that the conformal shield could be constructed in a manner similar to any of the conformal shields FIGS. 2–described above, or by using logical extensions to the concepts embodied therein.

Figure 7:
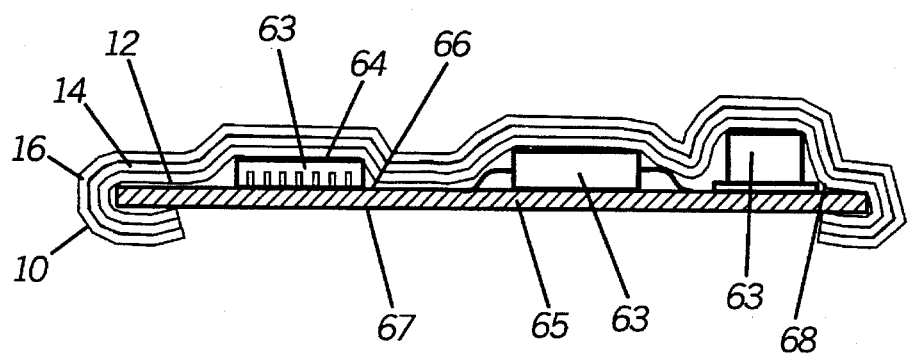
FIG. 7 is a cross-sectional view of the shielded circuit assembly of FIG. 6.

Referring to FIG. 7, a cross-sectional view of the shielded circuit assembly 10 is shown. The circuit substrate 65 is a printed circuit board which houses electrical circuitry including the electrical components 63. The printed circuit board 65 has first and second opposing surfaces 66, 67. The first surface 66 has electrical components 63 mounted thereon and the second surface 67 has an exposed ground plane thereon. The circuit assembly 10 may be combined with other electrical modules and circuitry to implement a product or device. In the preferred embodiment, the circuit assembly 10 implements a major portion of a two-way portable radio, and includes communication circuitry for communicating over a radio frequency channel. The electrical components 63 include a power amplifier module 64 which is typically a source of significant electro-magnetic interference. Additionally, the power amplifier module 64 typically requires a heat dissipation path for dissipating excessive heat generated by this module. The circuit assembly 10 may also include electrical components 63 which are sensitive to electro-magnetic interference and which can be adversely affected by interference generated by the power amplifier module 64 among other sources. Accordingly, the conformal shield 10 is disposed over each component 63 such that each component 63 is substantially enclosed.

In a primary application of the present invention, the conductive layer 16 of the conformal shield 10 provides electro-magnetic interference shielding. Preferably, the conductive layer 16 is electrically grounded, such as by grounding to the circuit substrate 65, to provide shielding to prevent radio frequency emissions from entering or leaving protected areas. The first insulated layer 12 ordinarily makes contact with the electrical component 63 and helps protect the electrical components 63 and other portions of the circuitry on the circuit substrate 65 from electrical shorts.

In constructing the shielded circuit assembly 10, the circuit substrate 65 is populated with electrical components 63 and electrical circuitry to form a functional electrical module. The circuit substrate 65 is then encased with the conformal shield 10 such that the electrical components 63 and at least a portion of the circuit substrate 65 is covered by the conformal shield 10. The conformal shield 10 can be applied to the circuit substrate 65 by vacuum forming the conformal shield 10 onto the circuit substrate 65. Alternatively, the conformal shield 10 may be performed on a mold of the circuit substrate 65 or other article which is to be shielded. Thermal energy is then applied to the conformal shield 10 such that the first insulating layer 12 reaches its softening point. The first insulating layer 12 conforms to the circuit substrate 65 and electrical components 63. Preferably, the conductive layer 16 is applied to the conformal shield base 15 to form the conformal shield 10 before vacuum forming occurs. The conformal shield 10 may also be constructed by first applying the conformal shield base 15 over the circuit substrate 65, then disposing the conductive layer 16 onto the conformal shield base 15, such as by metalizing the conformal shield base 15 while on the circuit substrate 65. Commonly available shrink or blister packaging technology can be used as a starting point for developing a manufacturing process.

Conventionally, EMI shielding is provided by enclosing critical components and/or the entire circuit assembly within a metal can which requires that space be reserved on the circuit assembly to accommodate the cans. The use of the conformal shield 10 for EMI shielding significantly reduces the number of parts required by eliminating the need for metal cans as shields. Furthermore, the additional space required on the circuit substrate to accommodate the shielding is relative small. This shielding approach is particularly useful when addressing product miniaturization and manufacturing cost reduction.

Figure 8:
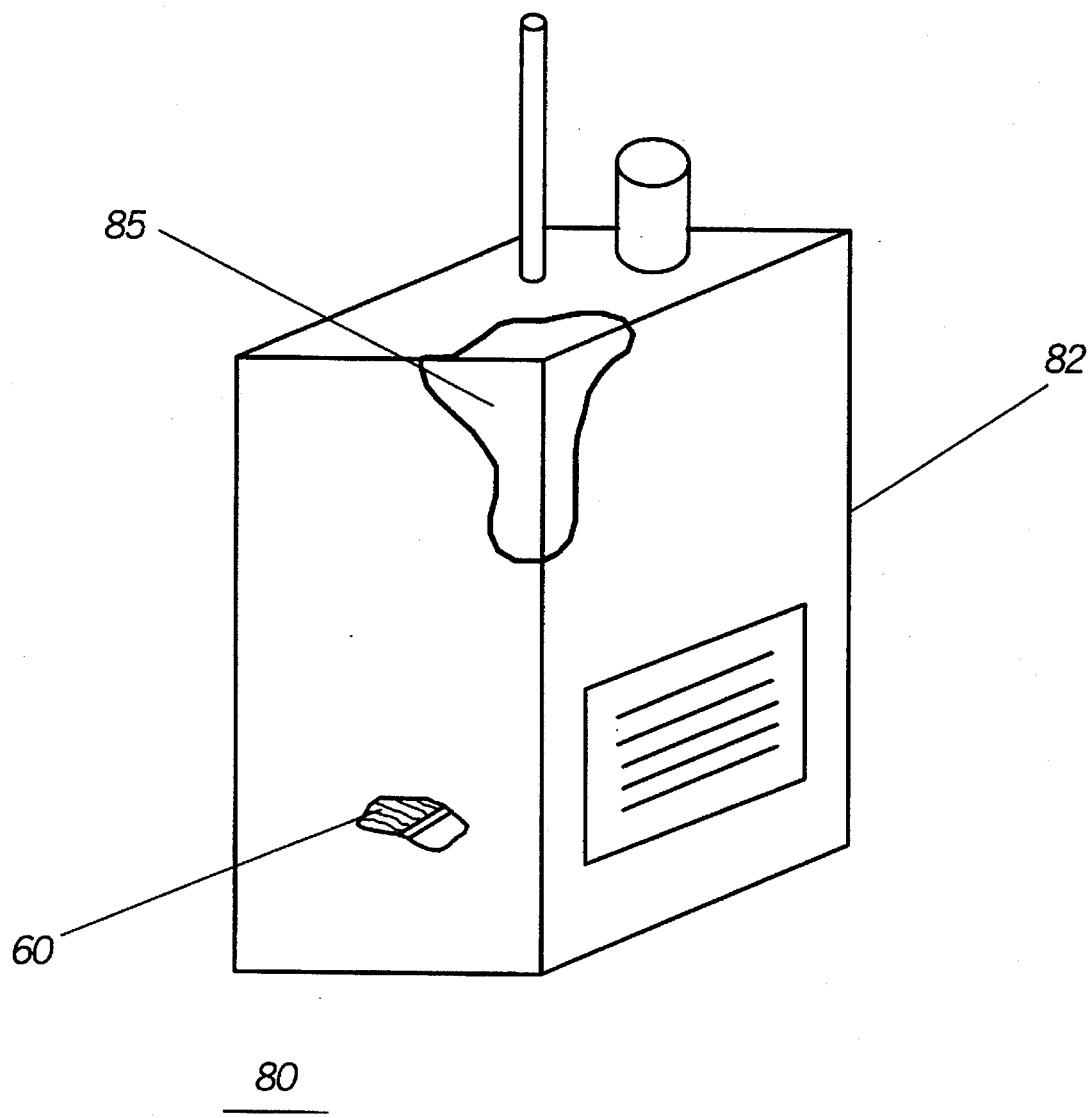
FIG. 8 is a fragmentary perspective view of a radio in accordance with the present invention.

Referring to FIG. 8, a fragmentary perspective view of a radio 80 is shown, in accordance with the present invention. The radio 80 is a portable two-way radio electronic device incorporating well known communications circuitry for communicating over a radio frequency channel. The radio 80 includes a radio housing 82 which houses the shielded circuit assembly 60 and other internal components of the radio 80. The radio housing 82 is itself shielded by a radio conformal shield 85 formed according to the present invention. The radio conformal shield 85 is disposed on the interior portion of the radio housing 82 and conforms to the interior of the radio housing 82. This radio shield 85 protects the internal components of the radio 80 from externally sourced interference, and also reduces radio emissions. As radio products become smaller, the benefits of such radio shields become greater.

The conformal shield 10 of the present invention offers significant benefits. These benefits include simple design and construction, low cost; and compact design. The conformal shield 10 provides EMI protection without adding significant size or weight to a product. Additionally this shielding technique can be used on articles which were not originally designed for EMI shielding. Moreover, design cycle time and design costs can be saved by eliminating the need to accommodate conventional metal can shields. The elimination of metal can shields also reduces the part count and overall product weight. A conformal shield 10 can be constructed to provide additional features. For example, the shielding material may be chosen to provide electrostatic discharge protection, electromagnetic pulse protection, and also to provide a thermal path for heat dissipation. Moreover, by fully encasing the article to be shielded, an effective moisture seal can be created for the article.

What is claimed is:
1. A conformal shield, comprising:
 a conformal shield base, comprising:
  a first conformable insulating material having a characteristic softening point at a first temperature;
  a second conformable insulating material overlaying the first conformable insulating material, the second conformable insulating material having a characteristic softening point at a second temperature higher than the first temperature; and
 a first conductive layer disposed on the conformal shield base; and
 a second conductive layer disposed on the first conductive layer.
2. The conformal shield of claim 1, wherein the first conductive layer is disposed on the second conformable insulating material.
3. The conformal shield of claim 1, wherein the first conductive layer comprises a conductive fabric.
4. The conformal shield of claim 3, wherein the conductive fabric comprises polyester impregnated with metal.
5. The conformal shield of claim 1, further comprising a third conformable insulating material disposed between the first and second conductive layers.
6. The conformal shield of claim 1, further comprising a third conformable insulating material disposed on the first conductive layer.
7. The conformal shield of claim 1, wherein the second conformable insulating material comprises nylon.
8. The conformal shield of claim 1, wherein the first conformable insulating material comprises polypropylene.
9. A conformal shield, comprising:
 a first conformable insulating material having a characteristic softening point at a first temperature;
 a conductive layer disposed on the first conformable insulating material;
 a second conformable insulating material disposed over the conductive layer, the second conformable insulating material having a characteristic softening point at a second temperature; and
 a third conformable insulating material disposed on the second conformable insulating material, the third conformable insulating material having a characteristic softening point at a third temperature higher than the first temperature and higher than the second temperature.
10. The conformal shield of claim 9, wherein the first and second temperatures are substantially equal.
11. A method of forming a conformal shield, the method comprising the steps of:
 disposing a conductive layer on a first conformable insulating material having a characteristic softening point at a first temperature;
 disposing a second conformable insulating material over the conductive layer, the second conformable insulating material having a characteristic softening point at a second temperature; and
 disposing a third conformable insulating material on the second conformable insulating material, the second conformable insulating material having a characteristic softening point at a third temperature higher than the first temperature and higher than the second temperature.
12. A method of forming a conformal shield on an article, the method comprising the steps of:
 providing a first conformable insulating material having a characteristic softening point at a first temperature overlaid with a second conformable insulating material having a characteristic softening point at a second temperature higher than the first temperature to form a conformal shield base; and disposing a first conductive layer on the second conformable insulating material;

providing an article;

vacuum forming the conformal shield base onto the article;

applying thermal energy to the conformal shield base such that the first conformable insulating material reaches the first characteristic softening point and the conformal shield base conforms to the article.

13. The method of claim 12, wherein the step of disposing a first conductive layer on the second conformable insulating material, includes the step of:

disposing a first conductive layer on the second conformable insulating material after the step of vacuum forming.

14. The method of claim 12, wherein the step of disposing a first conductive layer on the second conformable insulating material, includes the step of:

disposing a material having high heat dissipation characteristics.

15. The method of claim 12, wherein the step of disposing a first conductive layer on the second conformable insulating material, includes the step of:

disposing a material having high electrical conductivity.

16. The method of claim 12, wherein the step of disposing a first conductive layer on the second conformable insulating material, includes the step of:

disposing a material having semiconducting characteristics.

17. The method of claim 12, further comprising the step of disposing a second conductive layer on the first conductive layer.

18. The method of claim 17, further comprising the step of disposing a third conformable insulating material layer between the first and second conductive layers.

19. The method of claim 12, wherein the step of providing an article comprises the step of providing a circuit substrate having electrical components thereon.

20. The method of claim 12, wherein the step of providing an article comprises the step of providing a radio housing.

21. A method of forming a conformal shield for an article, the method comprising the steps of:

providing a first conformable insulating material having a characteristic softening point at a first temperature overlaid with a second conformable insulating material having a characteristic softening point at a second temperature higher than the first temperature to form a conformal shield base; and disposing a first conductive layer on the second conformable insulating material;

providing a mold of an article;

vacuum forming the conformal shield base onto the mold;

applying thermal energy to the conformal shield base such that the first conformable insulating material reaches the first characteristic softening point and the conformal shield base conforms to the mold.

* * * * *